(12) United States Patent  (10) Patent No.: US 7,432,598 B2
Kim  (45) Date of Patent: Oct. 7, 2008

(54) SEMICONDUCTOR DEVICE

(75) Inventor: Eun Ah Kim, Suwon-si (KR)

(73) Assignee: Samsung SDI Co., Ltd. (KR)

( * ) Notice: Subject to any disclaimer, the term of this patent is extended or adjusted under 35 U.S.C. 154(b) by 50 days.

(21) Appl. No.: 11/430,814

(22) Filed: May 9, 2006

(65) Prior Publication Data

US 2006/0275622 A1 Dec. 7, 2006

(30) Foreign Application Priority Data

May 11, 2005 (KR) .................. 10-2005-0039534

(51) Int. Cl.
H01L 29/40 (2006.01)
(52) U.S. Cl. .................. 257/758; 257/774; 257/775; 257/E23.145
(58) Field of Classification Search .......... 257/758, 257/759, 760, 774, 775, E23.143, E23.145, 257/E23.146
See application file for complete search history.

(56) References Cited

U.S. PATENT DOCUMENTS 7,180,154 B2 * 2/2007 Cho et al. ............ 257/529

FOREIGN PATENT DOCUMENTS

| JP | 63 260054 A | 10/1988 |
| JP | 03 263855 A | 11/1991 |
| JP | 04 093048 A | 3/1992 |
| KR | 10-1995-0011555 | 10/1995 |
| KR | 10-1996-002483 | 1/1996 |
| KR | 10-1998-031103 | 7/1998 |

OTHER PUBLICATIONS

EPO Search Report, Feb. 8, 2007, Application No. 06112404.6-1235.
EPO Office Action, Mar. 2, 2007, Application No. 06112404.6-1235.
Office Action of Chinese Patent Application No. 200610079084.8 dated Dec. 7, 2007.

* cited by examiner

Primary Examiner—Minh-Loan T Tran
(74) Attorney, Agent, or Firm—Knobbe, Martens, Olson & Bear, LLP

(57) ABSTRACT

A semiconductor device capable of reducing electrical leakage generated when a contact hole is misaligned and a manufacturing method thereof is disclosed. The semiconductor device includes three conductive layers with various and different portions overlapping each other. The conductive layers are separated by insulating layers and connected by contact holes formed in the insulating layers between the overlapping potions. Thus, electric leakage, caused by misalignment when forming the contact hole to electrically connect the conductive layers to each other, can be prevented.

12 Claims, 5 Drawing Sheets

SEMICONDUCTOR DEVICE

CROSS-REFERENCE TO RELATED APPLICATIONS

This application claims priority to and the benefit of Korean Patent Application No. 10-2005-0039534, filed on May 11, 2005, in the Korean Intellectual Property Office, the entire content of which is incorporated herein by reference.

BACKGROUND

1. Field of the Invention

The present invention relates to a semiconductor device and a manufacturing method thereof, and more particularly, to a semiconductor device capable of reducing the electrical leakage of a semiconductor device caused when a contact hole is misaligned and a manufacturing method thereof.

2. Discussion of Related Art

Recently, in conjunction with the development of ever higher density semiconductor devices which provide greater functionality, various information devices in which semiconductor devices are installed, such as computers, mobile phones, personal digital assistants, and the like, have grown ever more popular. Semiconductors installed in these information devices are required to have a high operating speed and a great deal of storage capacity. In order to satisfy these requirements, semiconductor device manufacturing technology is developing to improve integration, reliability, and response speed.

Moreover, as the degree of integration increases and the size of devices decrease, the distances between conductive layers forming the semiconductor devices gradually decrease. At its most basic level, the semiconductor device includes a plurality of conductive layers formed on a substrate and a plurality of insulating layers formed between the conductive layers. In order to form a semiconductor device with higher density in a more accurate way, a reduction in the thickness of the conductive layer or a reduction in the distance between the conductive layers (e.g., the thickness of the insulating layers) is typically proposed. However, by reducing the thickness of the conductive layers or the distance between the conductive layers, formation a contact hole electrically connecting the conductive layers to each other becomes more difficult.

Hereinafter, the conventional formation of a contact hole will be described with reference to the accompanying drawings.

FIG. 1A is a schematic plan view illustrating a conventional semiconductor device formed with a contact hole. FIG 1B is an enlarged side view taken along line I-I' in FIG. 1A. As shown in FIG. 1A and FIG 1B, a semiconductor device 100 includes a plurality of conductive layers 110, 120, and 130 formed on a substrate (not shown), a plurality of insulating layers 115 and 125 formed between the conductive layers 110 and 120 and between the conductive layers 120 and 130, respectively, and a contact hole 140 for electrically connecting a pair of conductive layers among the conductive layers 110, 120, and 130.

As shown in FIG. 1A, on top of the substrate, a "line-shaped" first conductive layer 110 is formed. When discussing "line-shaped" or "minus-shaped" conductive layers throughout the specification, the conductive layers may be a line segment or a displayed portion of a longer line, and the length, width, angle, and shape of the conductive layers are not limited to the sizes, angles, and shapes displayed by the drawings. Moreover, line-shaped and minus-shaped conductive layers may be shaped similarly, and the nomenclature is adopted only to identify the approximate orientation of the conductive layers in the drawings. Although not depicted in the drawings, a buffer layer is generally formed between the substrate and the first conductive layer 110, and can act as an insulating layer between the substrate and the first conductive layer 110. On top of the first conductive layer 110, a first insulating layer 115 is formed to cover at least the first conductive layer 110. On top of the first insulating layer 115, a minus-shaped second conductive layer 120 overlapped with at least some portion of the first conductive layer 110, is formed. On top of the second conductive layer 120, a second insulating layer 125 is formed to cover at least some of the second conductive layer 120. On top of the second insulating layer 125, a line-shaped third conductive layer 130 is formed at least partially overlapping the first conductive layer 110 and the second conductive layer 120. Within the second insulating layer 125, the contact hole 140 is formed to electrically connect the second conductive layer 120 to the third conductive layer 130. Thus, the contact hole 140 electrically connects the two adjacent conductive layers to each other.

However, when a plurality of conductive layers and insulating layers between adjacent conductive layers is built using either a reduction in thickness of the conductive layers or a reduction in distance between the conductive layers, the problem shown in FIGS. 2A and 2B may occur. FIG. 2A is a top schematic view of a contact hole in an unconventional formation position, and FIG. 2B is an enlarged side view taken along line II-II' in FIG. 2A. As shown in the drawings, contact hole 140 is electrically connected to conductive layers 120 and 130 to which the contact hole 140 must be electrically connected, and contact hole 140 is also electrically connected to conductive layer 110 to which contact hole 140 must not be electrically connected. Moreover, as shown in FIGS. 2A and 2B, when the formation position of the contact hole 140 is such that it is electrically connected to the conductive layer 110 to which the contact hole 140 must not be electrically connected, electric leakage may occur.

SUMMARY OF CERTAIN INVENTIVE ASPECTS

Accordingly, it is an aspect of the present invention to provide a semiconductor device in which the formation of the contact hole position may not deviate from the two adjacent conductive layers, which prevents electric leakage generated by such misalignment, and a manufacturing method thereof.

Another aspect is a semiconductor device including a first insulating layer formed on a substrate, a first conductive layer formed on the first insulating layer, a second insulating layer formed on the first conductive layer, a second conductive layer formed on the second insulating layer and having a first overlapping portion overlapped with the first conductive layer, a third insulating layer formed on the second conductive layer, a third conductive layer formed on the third insulating layer and having a second overlapping portion overlapped with the second conductive layer at a position different from the position of the first overlapping portion, and a contact hole formed in either the first overlapping portion or the second overlapping portion and electrically connecting two overlapped conductive layers to each other. A skilled technologist will recognize that such layering and formation of further contact holes can continue as much as needed for the particular device.

In one embodiment, each of the conductive layers is line-shaped, minus-shaped, or crank-shaped (e.g., ⌊, ⌋, ⌉, ⌈, or ⊥) and has at least one extending portion which extends from the shaped configuration a predetermined width and at a predetermined angle. In this embodiment, at least one of the plurality of line-shaped, minus-shaped, or crank-shaped conductive layers will have at least one extending portion extended to a predetermined width and having a predetermined angle.

The diameter of the contact hole preferably should not exceed the width of the conductive layers.

Other aspects of the present invention are achieved by providing a method of manufacturing a semiconductor device including the steps of forming a first insulating layer on a substrate, forming a first conductive layer on the first insulating layer, forming a second insulating layer on the first conductive layer, forming a second conductive layer on the second insulating layer and having a first overlapping portion overlapped with the first conductive layer, forming a third insulating layer on the second conductive layer, forming a third conductive layer on the third insulating layer and having a second overlapping portion overlapped with the second conductive layer at a position different from the position of the first overlapping portion, and forming a contact hole either between the first overlapping portion or between the second overlapping portion and electrically connecting two overlapped conductive layers to each other.

The third conductive layer further includes a third overlapping portion overlapped with the first conductive layer at a position different from the first and second overlapping portions. A contact hole is formed between the third overlapping portion and electrically connects two conductive layers to each other.

BRIEF DESCRIPTION OF THE DRAWINGS

These and/or other aspects and advantages of the invention will become apparent and more readily appreciated from the following description of the preferred embodiments, taken in conjunction with the accompanying drawings of which.

DETAILED DESCRIPTION OF CERTAIN INVENTIVE EMBODIMENTS

Hereinafter, various embodiments according to aspects of the present invention will be described with reference to the accompanying drawings.

Figure 1A:
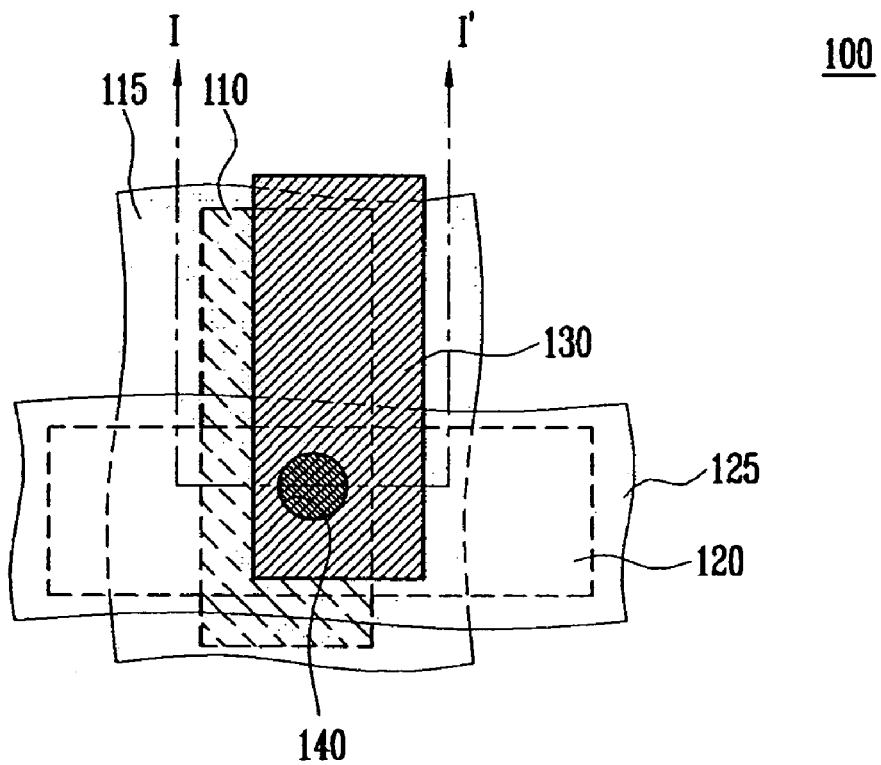
FIG. 1A is a partial schematic plan view illustrating a conventional contact hole structure formation.
Figure 1B:
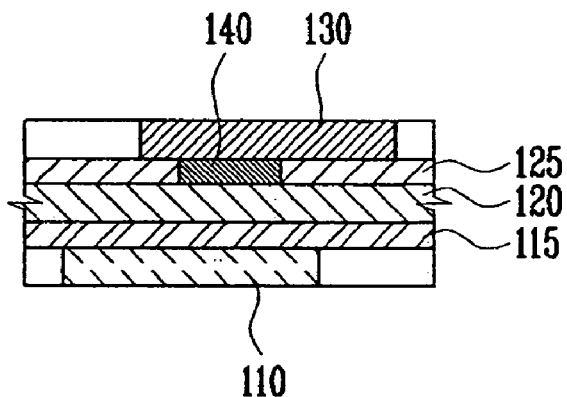
FIG. 1B is an enlarged side view taken along line I-I' in FIG 1A.
Figure 2A:
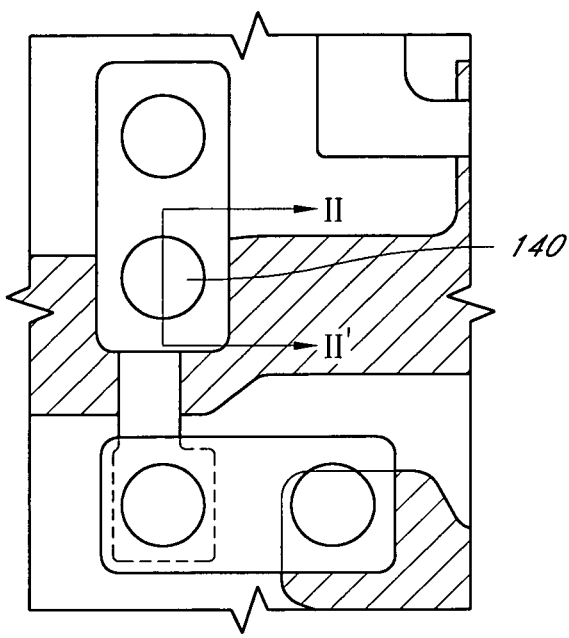
FIG. 2A is a top schematic view of the contact hole structure in an unconventional formation position.
Figure 2B:
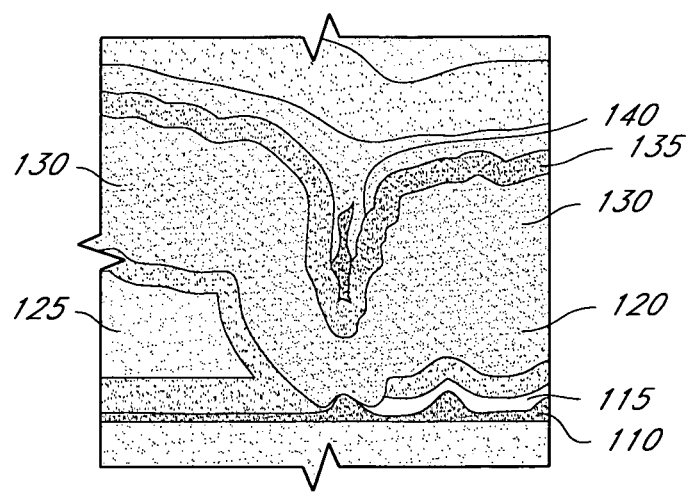
FIG. 2B is an enlarged side sectional view taken along the line II-II' in FIG. 2A.
Figure 3A:
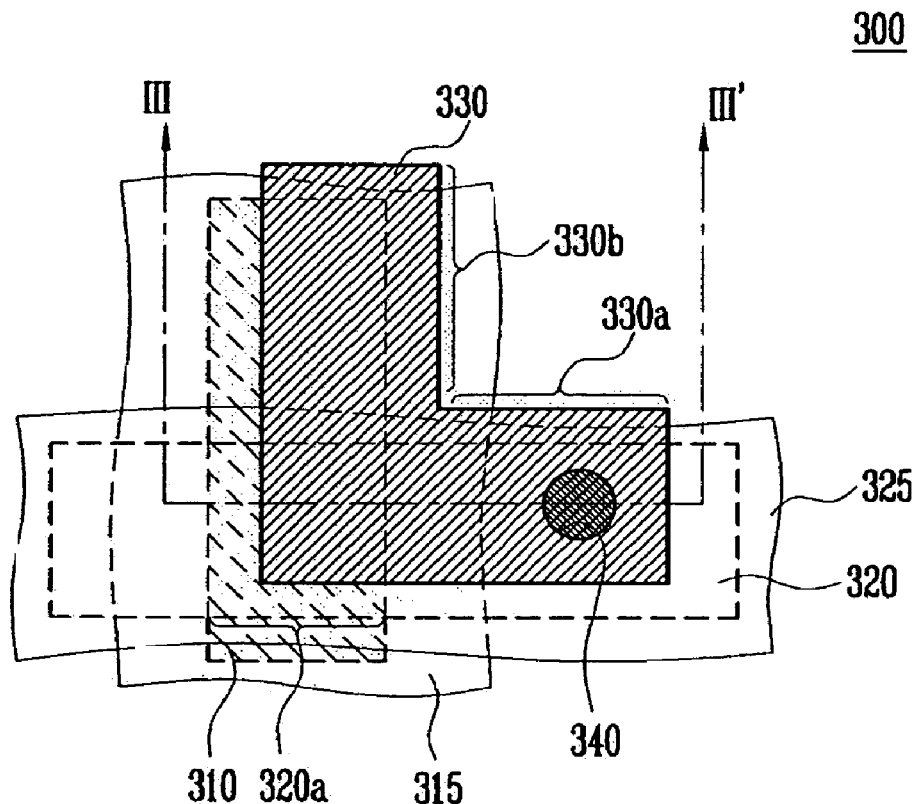
FIG. 3A is a partial schematic plan view illustrating a semiconductor device in which a contact hole is formed according to an embodiment of the present invention.
Figure 3B:
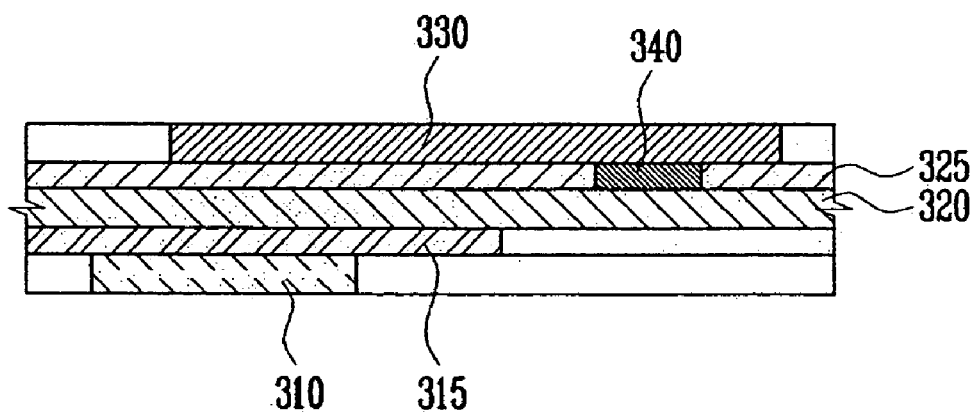
FIG. 3B is an enlarged side view taken along line III-III' in FIG. 3A.

FIG. 3A is a partial schematic plan view illustrating a semiconductor device in which a contact hole is formed according to an embodiment. FIG. 3B is an enlarged side view taken along line III-III' in FIG. 3A.

As shown in FIG. 3A and FIG. 3B, a semiconductor device 300 includes a buffer layer (not shown) formed on a substrate (not shown), a first conductive layer 310 formed on the buffer layer, a first insulating layer 315 formed on the first conductive layer 310, a second conductive layer 320 formed on the first insulating layer 315, a second insulating layer 325 formed on the second conductive layer 320, and a third conductive layer 330 formed on the second insulating layer 325.

In addition, the first conductive layer 310, formed on the buffer layer in the embodiment, is minus-shaped, and the first insulating layer 315 is formed on the first conductive layer 310. The first insulating layer 315 covers at least some region of the first conductive layer 310 such that the first conductive layer 310 does not contact the second and third conductive layers 320 and 330, respectively. The first insulating layer 315 has at least the same shape as the first conductive layer 310 in order to provide complete coverage of conductive layer 310.

The second conductive layer 320, formed on the first insulating layer 315, is line-shaped and has a first overlapping portion 320a partially overlapped with the first conductive layer 310. The second insulating layer 325, formed on the second conductive layer 320, covers at least some region of the second conductive layer 320, and, in this embodiment, has at least the same shape as that of the second conductive layer 320 in order to provide complete coverage of conductive layer 320.

The third conductive layer 330, formed on the second insulating layer 325, is cranked-shaped with at least one portion extended to a predetermined width and angle. FIG. 3A depicts a ⌊-type crank-shaped third conductive layer 330. The third conductive layer 330 includes a second overlapping portion 330a which is overlapped with the second conductive layer 320, but is not overlapped with the first overlapping portion 320a, as well as a third overlapping portion 330b which is overlapped with the first conductive layer 310, but is not overlapped with the first overlapping portion 320a or the second overlapping portion 330a.

Between each of the conductive layers 310, 320, and 330, contact holes may be formed for electrically connecting two of the conductive layers 310, 320, and 330 to each other conductive layer. Although formed between conductive layers, a skilled technologist will recognize that the contact holes may extend into the conducting layers, for example as a result of over-etching. FIG. 3A depicts a contact hole 340 for electrically connecting the second conductor 320 layer to the third conductive layer 330 in the second overlapping portion 330a, although one will recognize that other configurations are possible. For example, contact hole 340 may alternatively be formed in the third overlapping portion 330b or the first overlapping portion 320a. The widths of the conductive layers 310, 320, and 330 may be identical or different. The diameter of the contact hole 340 preferably does not exceed the width of the overlapped conductive layer portion within which it is formed. Particularly, when the widths of the overlapped conductive layers are different from each other, the diameter of the contact hole 340 preferably does not exceed the width of the overlapped conductive layers. This is because any misalignment may lead to etching into areas that should be insulated from the conductive layers being connected. In order to avoid unnecessary duplication, a detailed description of structure formation is omitted if it would be identical to the description provided for by the previously described embodiment.

Figure 4A:
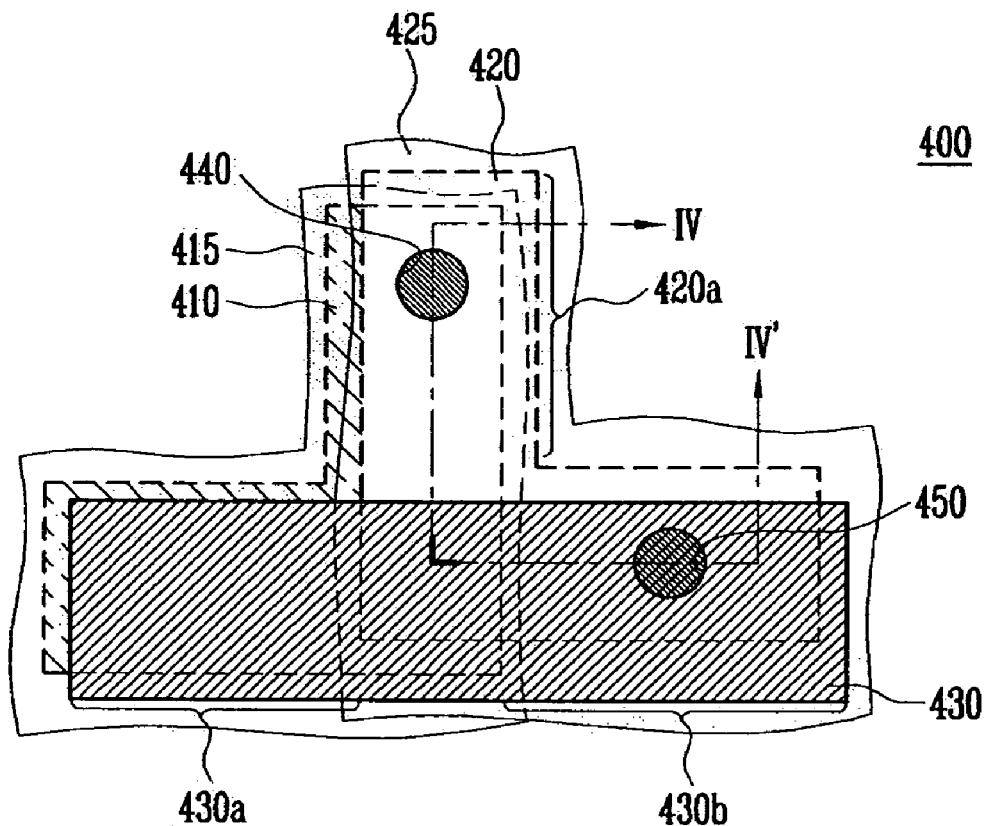
FIG. 4A is a partial schematic plan view illustrating a semiconductor device in which a contact hole is formed according to another embodiment of the present invention.
Figure 4B:
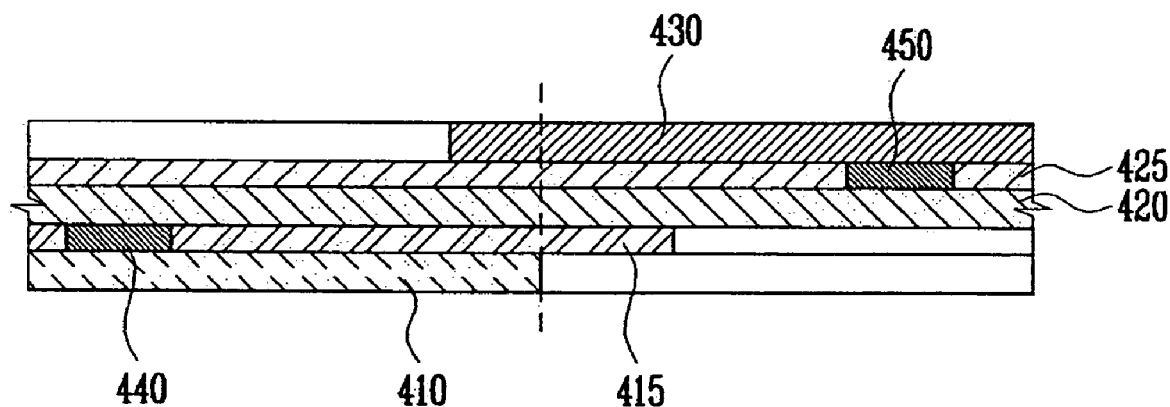
FIG. 4B is an enlarged side view taken along line IV-IV' in FIG. 4A.

FIG. 4A is a partial schematic plan view illustrating a semiconductor device in which a contact hole is formed according to another embodiment of the present invention. FIG. 4B is an enlarged side view taken along line IV-IV' in FIG. 4A.

As shown in FIG. 4A and FIG. 4B, a semiconductor device 400 includes a buffer layer (not shown) formed on a substrate (not shown), a first conductive layer 410, a first insulating layer 415, a second conductive layer 420, a second insulating layer 425, and a third conductive layer 430.

In addition, in this embodiment, the first conductive layer 410, formed on the buffer layer, is ]-type crank-shaped. The first insulating layer 415 is formed on the first conductive layer 410 to prevent the first conductive layer 410 from contacting the second conductive layer 420 and the third conductive layer 430, and to cover the first conductive layer 410. The second conductive layer 420, formed on the first insulating layer 415, is ⌊-type cranked-shaped and has a first overlapping portion 420a partially overlapped with the first conductive layer 410. The second insulating layer 425 is formed on the second conductive layer 420 to prevent the second conductive layer 420 from directly contacting the third conductive layer 430, and to cover the second conductive layer 420.

The third conductive layer 430, formed on either the first insulating layer 415 or the second insulating layer 425, is minus-shaped in this embodiment. The third conductive layer 430 includes the second overlapping portion 430a which is overlapped with the first conductive layer 410, but is not overlapped with the first overlapping portion 420a, and the third overlapping portion 430b which is overlapped with the second conductive layer 420, but is not overlapped with the first overlapping portion 420a or the second overlapping portion 430a.

Between each of the conductive layers 410, 420, and 430, a plurality of contact holes may be formed to electrically connect two of the conductive layers 410, 420, and 430 to each other. In this embodiment, a contact hole 440 is formed in the first overlapping portion 420a, where the first conductive layer 410 is overlapped with the second conductive layer 420, and electrically connects the first conductive layer 410 to the second conductive layer 420. A contact hole 450 is formed in the third overlapping portion 430b, where the second conductive layer 420 is overlapped with the third conductive layer 430, and electrically connects the second conductive layer 420 to the third conductive layer 430. The contact holes 440 and 450 generally do not have diameters that exceed the widths of the overlapped conductive layers 410 and 420 and the overlapped conductive layers 420 and 430, respectively, and are formed by etching. Moreover, not shown in the drawing, a contact hole may be further formed in the second overlapping portion 430a for electrically connecting the third conductive layer 430 and the first conductive layer 410.

Figure 5A:
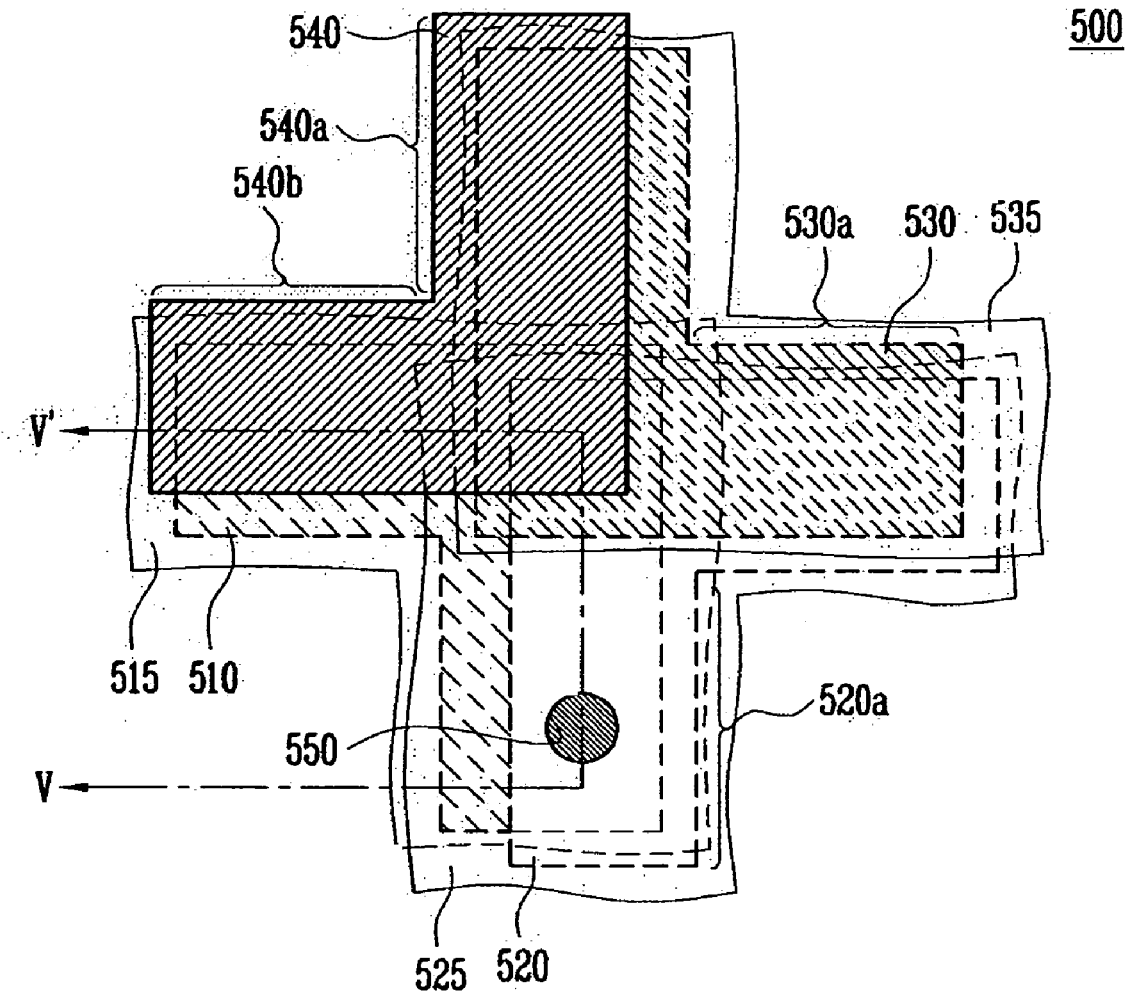
FIG. 5A is a partial schematic plan view illustrating a semiconductor device in which a contact hole is formed according to yet another embodiment of the present invention.
Figure 5B:
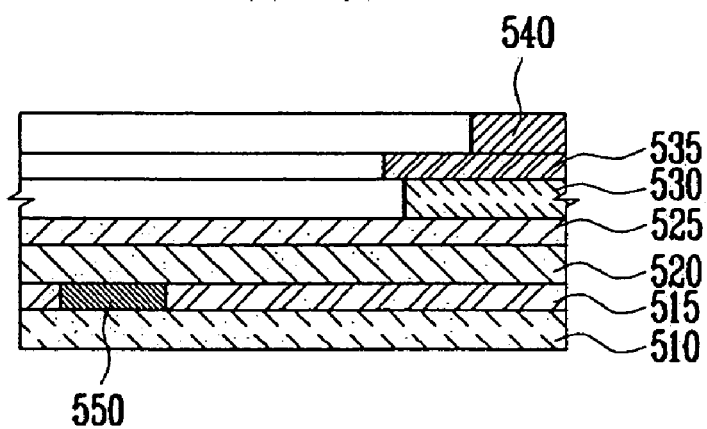
FIG. 5B is an enlarged side view taken along line V-V' in FIG. 5A.

FIG. 5A is a partial schematic plan view illustrating a semiconductor device in which a contact hole is formed according to yet another embodiment of the present invention. FIG. 5B is an enlarged side view taken along line V-V' in FIG. 5A.

As shown in FIG. 5A and FIG. 5B, a semiconductor device 500 includes a buffer layer (not shown) formed on a substrate (not shown), a first conductive layer 510, a first insulating layer 515, a second conductive layer 520, a second insulating layer 525, a third conductive layer 530, a third insulating layer 535, and a fourth conductive layer 540.

In addition, in this embodiment, the first conductive layer 510, formed on the buffer layer, is ]-type crank-shaped. The first insulating layer 515 is formed on the first conductive layer 510 to prevent the first conductive layer 510 from directly contacting the second, third, and fourth conductive layers 520, 530, and 540, respectively, and to cover the first conductive layer 510. The second conductive layer 520, formed on the first insulating layer 515, is ⌈-type crank-shaped and has a first overlapping portion 520a partially overlapped with the first conductive layer 410. The second insulating layer 525 is formed on the first conductive layer 520 to prevent the second conductive layer 520 from directly contacting the third conductive layer 530 and the fourth conductive layer 540, and to cover the second conductive layer 520.

The third conductive layer 530, formed on either the first insulating layer 515 or the second insulating layer 525, is ⌊-type crank-shaped in this embodiment. The third conductive layer 530 includes a second overlapping portion 530a which is overlapped with the second conductive layer 520. The third insulating layer 535 is formed on the third conductive layer 530 to prevent the third conductive layer 530 from directly contacting the fourth conductive layer 540, and to cover the third conductive layer 530. The fourth conductive layer 540, formed on the third conductive layer 530, is ]-type crank-shaped. The fourth conductive layer 540 includes the third overlapping portion 540a overlapped with the third conductive layer 530 and the fourth overlapping portion 540b overlapped with the first conductive layer 510.

Between each of the conductive layers 510, 520, 530, and 540, a plurality of contact holes may be formed to electrically connect two of the conductive layers to each other. A contact hole 550 is formed in the first overlapping portion 520a and electrically connects the first conductive layer 510 to the second conductive layer 520.

Moreover, not shown in the drawing, a contact hole may be formed in the second overlapping portion 530a where the second conductive layer 520 is overlapped with the third conductive layer 530 to electrically connect the second conductive layer 520 to the third conductive layer 530. Contact holes may be further formed in the third overlapping portion 540a where the third conductive layer 530 is overlapped with the fourth conductive layer 540 to electrically connect the third conductive layer 530 to the fourth conductive layer 540 and/or in the fourth overlapping portion 540b where the first conductive layer 510 is overlapped with the fourth conductive layer 540 to electrically connect the first conductive layer 510 to the fourth conductive layer 540. The widths of the first, second, third, and fourth conductive layers 510, 520, 530, and 540, respectively may be identical or different. The contact hole 550 preferably does not have a diameter that exceeds the width of the overlapped conductive layers. If the widths of the overlapped conductive layers are different from each other, the diameter of the contact hole 550 preferably does not exceed the thinnest width of the overlapped conductive layers.

As described in the embodiments, contact holes are formed in a semiconductor device in which a plurality of conductive layers are laminated. Since another conductive layer is not present at the lower portion of the overlapping portion in which two conductive layers are overlapped, a contact hole is not formed in a position allowing deviation from the conductive layers to which the contact hole must be connected electrically, and not formed in a position where it may become electrically connected to other conductive layers to which the contact hole should not be electrically connected. Moreover, if a contact hole is not formed in the overlapping portion of two conductive layers but deviates from its predetermined position, the contact hole is very unlikely to contact another conductive layer.

The structures in the embodiments of a plurality of conductive layers that are not laminated but that differ slightly in position do not limit the present invention, and are disclosed for illustrative purposes only. Moreover, overlapping portions where a plurality of layers is overlapped are described in detail for illustrative purposes only.

Although the above-mentioned embodiments disclose structures in which three or four conductive layers are laminated, more than three or four layers can be laminated. The configuration of the laminated conductive layers is not limited to the disclosed structure.

Although a few embodiments of the present invention have been shown and described, those skilled in the art would appreciate that changes may be made in these embodiments without departing from the principles and spirit of the invention, the scope of which is defined in the claims and their equivalents.

As described above, the contact hole is formed in the overlapping portion formed by the overlapped conductive layers so that the contact hole is prevented from deviating from the conductive layer to which the contact hole should be electrically connected, and is prevented from being electrically connected to a conductive layer to which the contact hole should not be electrically connected. Further, electrical leakage generated by misalignment of one of the conductive layers and the contact hole can also be nearly prevented.

What is claimed is:

1. A semiconductor device comprising:
   a first insulating layer formed over a substrate;
   a first conductive layer formed over the first insulating layer;
   a second insulating layer formed over the first conductive layer;
   a second conductive layer formed over the second insulating layer and having a first overlapping portion that overlaps the first conductive layer at a first position;
   a third insulating layer formed over the second conductive layer;
   a third conductive layer formed over the third insulating layer, the third conductive layer having a second overlapping portion that overlaps the second conductive layer at a second position different from the first position and having a third overlapping portion that overlaps the first conductive layer and the second conductive layer at a third position different from the first and second positions; and
   a contact hole formed in at least one of the first overlapping portion and the second overlapping portion and electrically connecting two out of said first, second, and third conductive layers to each other.

2. The semiconductor device of claim 1, wherein each of the conductive layers is one of a line shape or a L-type cranked shape having at least one extending portion extended to a predetermined width.

3. The semiconductor device of claim 2, wherein at least one of the plurality of conductive layers is a line shape having at least one extending portion extended to a predetermined width.

4. The semiconductor device of claim 3, wherein the diameter of the contact hole is less than the widths of the overlapped conductive layers.

5. The semiconductor device of claim 1, wherein no contact holes are formed between the third conductive layer and either the first conductive layer or the second conductive layer in the third overlapping portion.

6. The semiconductor device of claim 1, wherein no contact holes are formed in the third overlapping portion.

7. The semiconductor device of claim 1, wherein the third conductive layer has a fourth overlapping portion that overlays the first conductive layer at a fourth position different from the first, second, and third positions.

8. A semiconductor device comprising:
   a first metal line extending in a first direction on a first level;
   a second metal line extending in a second direction generally transverse to the first direction, the second metal line being on a second level, the second level higher than the first level;
   a third metal line extending generally in the first direction, the third metal line being on a third level, the third level higher than the second level, the third metal line including a first portion overlapping the first metal line, the third metal line including a second portion overlapping the first metal line and the second metal line;
   a protuberance electrically connected to the third metal line, the protuberance extending generally in the second direction on the third level, the protuberance overlapping a portion of the second metal line; and
   an interconnect electrically and mechanically connecting the protuberance and portion of the second metal line.

9. The semiconductor device of claim 8, further comprising:
   a second protuberance connected to the first metal line, the second protuberance extending generally in the second direction on the first level, the second protuberance being overlapped by a second portion of the second metal line; and
   a second interconnect electrically and mechanically connecting the second protuberance and the second portion of the second metal line.

10. The semiconductor device of claim 8, further comprising:
    a second protuberance connected to the second metal line, the second protuberance extending generally in the first direction on the second level, the second protuberance overlapping a portion of the first metal line; and
    a second interconnect electrically and mechanically connecting the second protuberance and the portion of the first metal line.

11. The semiconductor device of claim 8, wherein no interconnects are formed between the third metal line and either the first metal line or the second metal line where the first, second, and third metal lines overlap.

12. The semiconductor device of claim 8, wherein no interconnects are formed where the first, second, and third metal lines overlap.

* * * * *